(12) United States Patent
Okino et al.

(10) Patent No.: US 9,048,159 B2
(45) Date of Patent: Jun. 2, 2015

(54) SOLID-STATE IMAGING DEVICE AND METHOD FOR FABRICATING THE SAME

(71) Applicant: PANASONIC CORPORATION, Osaka (JP)

(72) Inventors: Toru Okino, Osaka (JP); Mitsuyoshi Mori, Kyoto (JP); Yutaka Hirose, Kyoto (JP); Yoshihisa Kato, Shiga (JP); Tsuyoshi Tanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/067,883

(22) Filed: Oct. 30, 2013

(65) Prior Publication Data

US 2014/0054737 A1 Feb. 27, 2014

Related U.S. Application Data

(63) Continuation of application No. PCT/JP2012/002547, filed on Apr. 12, 2012.

(30) Foreign Application Priority Data

May 31, 2011 (JP) ................................ 2011-121575

(51) Int. Cl.
*H01L 21/00* (2006.01)
*H01L 27/148* (2006.01)
*H01L 27/146* (2006.01)

(52) U.S. Cl.
CPC ...... *H01L 27/14632* (2013.01); *H01L 27/1462* (2013.01); *H01L 27/1463* (2013.01); *H01L 27/1464* (2013.01); *H01L 27/14685* (2013.01); *H01L 27/14689* (2013.01); *H01L 27/14687* (2013.01)

(58) Field of Classification Search
CPC .................................................. H01L 27/14632
USPC ............... 257/223, 228, 230, 447; 438/57, 70
See application file for complete search history.

(56) References Cited

U.S. PATENT DOCUMENTS

| 7,285,808 B2* | 10/2007 | Kasuga .......................... 257/223 |
| 7,315,014 B2* | 1/2008 | Lee et al. .................... 250/208.1 |
| 8,357,984 B2* | 1/2013 | Mao et al. ...................... 257/447 |
| 2010/0096718 A1 | 4/2010 | Hynecek et al. | |
| 2010/0201834 A1* | 8/2010 | Maruyama et al. ........ 348/222.1 |

FOREIGN PATENT DOCUMENTS

| JP | 2004-071817 A | 3/2004 |
| JP | 2006-054252 A | 2/2006 |

OTHER PUBLICATIONS

International Search Report issued in International Application No. PCT/JP2012/002547 with Date of mailing Jun. 12, 2012.

* cited by examiner

*Primary Examiner* — Calvin Lee
(74) *Attorney, Agent, or Firm* — McDermott Will & Emery LLP

(57) ABSTRACT

A solid-state imaging device includes: a substrate; an insulator layer formed on the substrate; a semiconductor layer formed on the insulator layer; and a silicon layer formed on the semiconductor layer. The silicon layer includes a plurality of pixels each including a photoelectric converter configured to convert light into signal charge, and a circuit configured to read the signal charge, and a refractive index of the insulator layer is lower than a refractive index of the semiconductor layer.

17 Claims, 15 Drawing Sheets

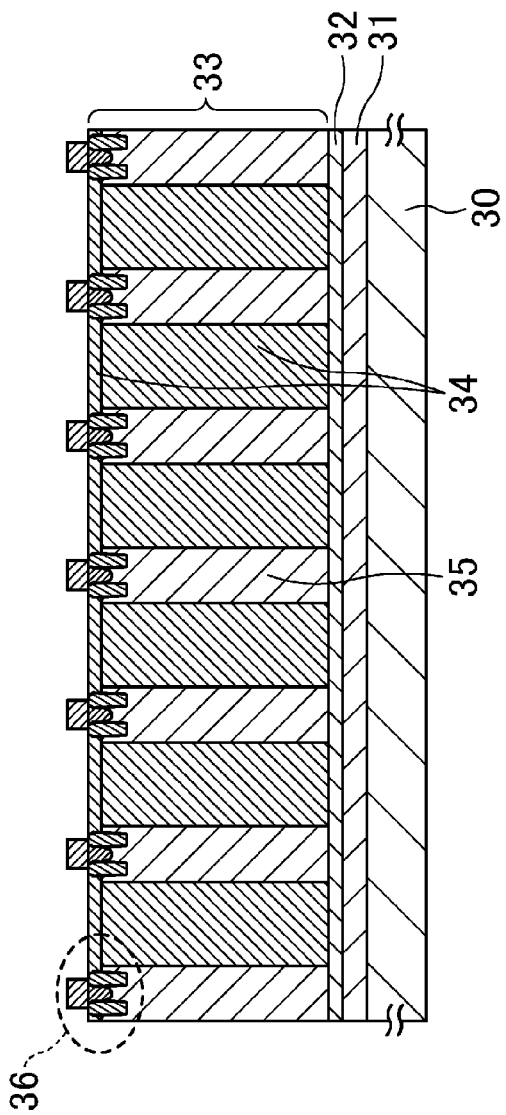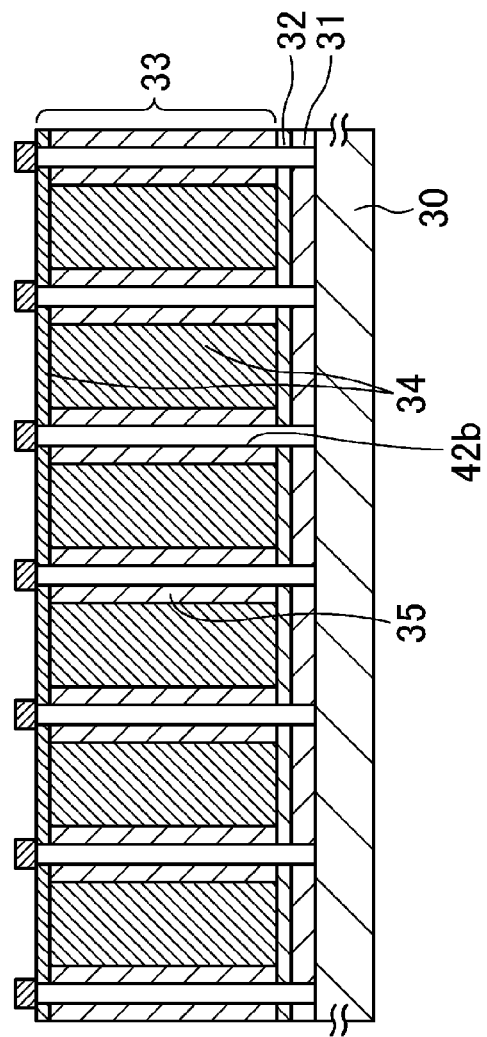

SOLID-STATE IMAGING DEVICE AND METHOD FOR FABRICATING THE SAME

CROSS-REFERENCE TO RELATED APPLICATIONS

This is a continuation of International Application No. PCT/JP2012/002547 filed on Apr. 12, 2012, which claims priority to Japanese Patent Application No. 2011-121575 filed on May 31, 2011. The entire disclosures of these applications are incorporated by reference herein.

BACKGROUND

The present disclosure relates to solid-state imaging devices and methods for fabricating the same, and more particularly to a solid-state imaging device, such as a MOS image sensor, including pixels that each include a photoelectric converter and are arranged in an array pattern, and a method for fabricating the same.

In recent years, there has been a demand for higher image quality and downsizing of solid-state imaging devices. However, the degree to which the pixel size is reduced is physically limited, and a reduction in pixel size causes a significant problem of a reduction in sensitivity.

Conventional solid-state imaging devices configured to solve such a problem have been proposed in, e.g., Japanese Patent Publication No. 2006-54252 and Japanese Patent Publication No. 2004-71817. Conventional first and second solid-state imaging devices will be described hereinafter with reference to FIGS. 15 and 16.

As illustrated in FIG. 15, the conventional first solid-state imaging device includes a photoelectric converter 102 formed on an SOI (silicon on insulator) substrate 100. Specifically, the SOI substrate 100 includes a plurality of silicon layers 101a and 101b, and a buried insulating film 103 formed between the silicon layers 101a and 101b. The silicon layer 101b on the buried insulating film 103 includes the photoelectric converter 102. The buried insulating film 103 is configured to reflect long wavelength light, and improving the absorption efficiency of long wavelength light in the photoelectric converter 102 enhances the sensitivity. Since the structure of the conventional first solid-state imaging device enhances the sensitivity, the shallow photoelectric converter 102 can be formed, thereby reducing optical crosstalk between adjacent pixels.

As illustrated in FIG. 16, similarly to the conventional first solid-state imaging device, the conventional second solid-state imaging device includes a reflector structure 202 under a semiconductor layer 200 including a photoelectric converter 201. Specifically, the reflector structure 202 is, not a single insulating film, but a layered structure of a silicon dioxide ($SiO_2$) film and a silicon nitride (SiN) film, and enhances the sensitivity of the photoelectric converter 201 to long wavelength light. Although not shown, a convex lens and a concave lens are formed on the photoelectric converter 201 to allow light to enter the photoelectric converter 201 in a direction perpendicular to the surface of the semiconductor layer 200, thereby reducing optical crosstalk.

SUMMARY

However, in a conventional solid-state imaging device, a silicon layer or a semiconductor layer including a photoelectric converter is in contact with a reflector structure, and thus, the silicon or semiconductor layer contains many crystal defects, and is inferior in crystal quality to a usual bulk substrate. Thus, the conventional solid-state imaging device causes a problem, such as white blemishes resulting from a poor-quality crystal of the silicon or semiconductor layer including the photoelectric converter.

It is therefore an object of the present disclosure to provide a high-sensitivity solid-state imaging device that can prevent defects in a photoelectric converter, such as white blemishes.

In order to achieve the object, a solid-state imaging device of the present disclosure includes a silicon layer formed on an insulator layer with a semiconductor layer interposed therebetween.

Specifically, a solid-state imaging device according to the present disclosure includes: a substrate; an insulator layer formed on the substrate; a semiconductor layer formed on the insulator layer; a silicon layer formed on the semiconductor layer; and a plurality of pixels formed in the silicon layer. The plurality of pixels each include a photoelectric converter configured to convert light into signal charge, and a circuit configured to read the signal charge. A refractive index of the insulator layer is lower than a refractive index of the semiconductor layer.

Since the solid-state imaging device of the present disclosure includes the semiconductor layer formed on the insulator layer, and the silicon layer including the photoelectric converters formed on the semiconductor layer, this can reduce crystal defects in the silicon layer including the photoelectric converters. This permits the solid-state imaging device to prevent, e.g., white blemishes arising from crystal defects in the silicon layer. Furthermore, since the refractive index of the insulator layer is lower than that of the semiconductor layer, and incident light can be reflected off the interface between the insulator layer and the semiconductor layer, this can enhance the sensitivity, in particular, to long wavelength light.

In the solid-state imaging device of the present disclosure, the insulator layer may contain any one of a silicon oxide film, a silicon nitride film, and a metal oxide film that each contain an impurity.

In the solid-state imaging device of the present disclosure, the insulator layer preferably contains a p-type impurity, and a concentration of the p-type impurity in the insulator layer is preferably greater than or equal to about $1\times10^{10}$ ions/cm$^2$.

This configuration allows the concentration of holes in the semiconductor layer to be kept constant, thereby enhancing the effect of preventing, e.g., crystal defects from being formed in the silicon layer after the formation of the silicon layer.

In the solid-state imaging device of the present disclosure, the semiconductor layer is preferably made of silicon containing an impurity, and a concentration of the impurity in the semiconductor layer is preferably greater than or equal to about $1\times10^{17}$ ions/cm$^3$.

This configuration can enhance the effect of preventing, e.g., crystal defects from being formed in the silicon layer after the formation of the silicon layer.

In the solid-state imaging device of the present disclosure, an SFQR of an interface between the insulator layer and the semiconductor layer, which is a local flatness of the interface, is preferably equal to or less than about 0.1 μm.

This prevents irregular reflections of light off the interface between the insulator layer and the semiconductor layer, thereby preventing optical crosstalk between adjacent pixels. Furthermore, an improvement in reflectivity can enhance the sensitivity.

In the solid-state imaging device of the present disclosure, the silicon layer preferably includes an imaging area on which light is incident, and an optical black area shielded from light to prevent light from entering the optical black area, and a groove is preferably formed between the imaging area and the optical black area to pass through the silicon layer, the semiconductor layer, and the insulator layer and expose a part of the substrate.

Thus, the groove can prevent light reflected off the interface between the insulator layer and the semiconductor layer from entering the optical black area, thereby reducing signal noises generated in the optical black area including reference pixels.

In the solid-state imaging device of the present disclosure, the plurality of pixels include a first pixel and a second pixel. The first pixel includes a first photoelectric converter, and the second pixel includes a second photoelectric converter adjacent to the first photoelectric converter. A groove is preferably formed between the first photoelectric converter and the second photoelectric converter to pass through the silicon layer, the semiconductor layer, and the insulator layer and expose parts of the substrate.

Thus, the groove between the first and second photoelectric converters prevents light obliquely incident on one of corresponding adjacent pixels from entering the other pixel, thereby preventing optical crosstalk.

In this case, the groove is preferably filled with a polysilicon film, and the semiconductor layer is preferably fixed to a ground potential through the polysilicon film.

This can prevent noise charge from leaking into the photoelectric converters, thereby providing a high-quality image.

Alternatively, in the case, the substrate is preferably an n-type semiconductor substrate, and is preferably fixed to a power supply potential.

This enables the discharge of a surplus of charge to the substrate.

In the solid-state imaging device of the present disclosure, a width of the groove preferably increases from the semiconductor layer to the substrate.

Thus, incident light is reflected to concentrate on a central portion of the photoelectric converter, thereby preventing optical crosstalk and further enhancing the sensitivity.

In the solid-state imaging device of the present disclosure, portions of the insulator layer corresponding to the pixels preferably have different thicknesses.

Thus, the reflection properties of a portion of the insulator layer corresponding to each of the pixels can be adjusted to correspond to the properties of a color filter of the pixel, thereby enhancing the sensitivity to an adequate level, and preventing optical crosstalk.

Preferably, in the solid-state imaging device of the present disclosure, the plurality of pixels include a first pixel and a second pixel. The first pixel includes a first photoelectric converter, the second pixel includes a second photoelectric converter adjacent to the first photoelectric converter, the solid-state imaging device further includes a first color filter and a second color filter formed on the first photoelectric converter and the second photoelectric converter, respectively, light having a longer wavelength than a wavelength of light transmitted through the second color filter is transmitted through the first color filter, and part of the first photoelectric converter is located under the second photoelectric converter.

This prevents long wavelength light that enters each of the photoelectric converters but is not completely absorbed by the photoelectric converter from leaking into a pixel adjacent to a corresponding pixel after being reflected off the interface between the insulator layer and the semiconductor layer, thereby preventing optical crosstalk.

In this case, green light is preferably transmitted through the first color filter, and blue light is preferably transmitted through the second color filter.

This can prevent optical crosstalk from green pixels to other pixels without reducing the sensitivity of blue pixels, and can enhance the sensitivity of the green pixels.

A method for fabricating a solid-state imaging device according to the present disclosure includes: forming an insulator layer on a substrate; forming a semiconductor layer on the insulator layer; forming a silicon layer on the semiconductor layer; and forming a plurality of pixels in the silicon layer. The plurality of pixels each include a photoelectric converter configured to convert light into signal charge, and a circuit configured to read the signal charge. A refractive index of the insulator layer is lower than a refractive index of the semiconductor layer.

Since the method of the present disclosure includes: forming the semiconductor layer on the insulator layer; and forming the silicon layer on the semiconductor layer, this can reduce crystal defects in the silicon layer including the photoelectric converters. This permits the solid-state imaging device to prevent, e.g., white blemishes arising from crystal defects in the silicon layer. Furthermore, since the refractive index of the insulator layer is lower than that of the semiconductor layer, and incident light can be reflected off the interface between the insulator layer and the semiconductor layer, this can enhance the sensitivity, in particular, to long wavelength light.

The method according to the present disclosure preferably further includes: forming a groove to pass through the silicon layer, the semiconductor layer, and the insulator layer and expose a part of the substrate.

As described above, the method of the present disclosure can provide a high-sensitivity solid-state imaging device that can prevent defects in the photoelectric converters, such as white blemishes.

BRIEF DESCRIPTION OF THE DRAWINGS

FIGS. 12A and 12B are cross-sectional views sequentially illustrating other process steps in the method for fabricating a solid-state imaging device according to each of the first through fourth embodiments.

DETAILED DESCRIPTION

First Embodiment

A solid-state imaging device according to a first embodiment will be described with reference to FIGS. 1-4. The present disclosure is not limited to the following embodiments. Various changes and modifications may be made without departing from the scope of the invention. The following embodiments may be combined with other embodiments.

Figure 1:
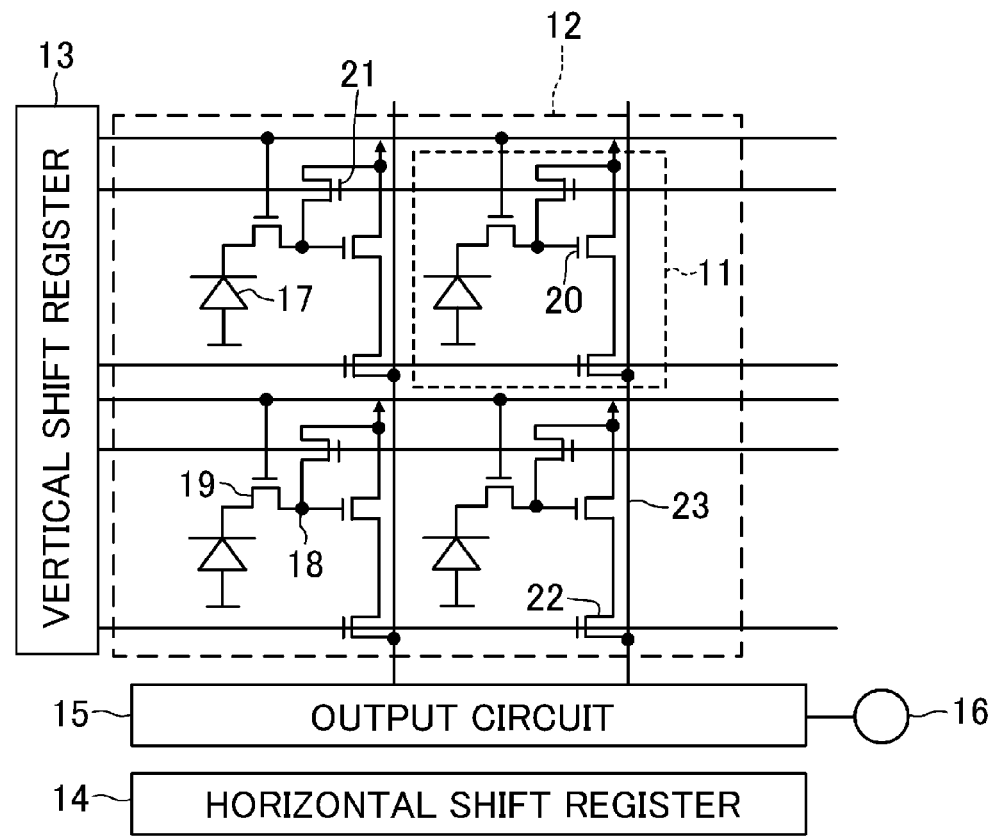
FIG. 1 is a circuit diagram illustrating a solid-state imaging device according to a first embodiment.

As illustrated in FIG. 1, a solid-state imaging device 10 according to the first embodiment is a metal oxide semiconductor (MOS) image sensor including a plurality of pixels 11 arranged in an array pattern. The solid-state imaging device 10 includes a pixel array region 12 including the pixels 11 arranged in an array pattern, a vertical shift register 13, a horizontal shift register 14, an output circuit 15, and an output terminal 16.

The pixels 11 in the pixel array region 12 each include a photodiode 17 serving as a photoelectric converter, a floating diffusion portion 18, a transfer transistor 19, an amplifier transistor 20, a reset transistor 21, and a selection transistor 22. The output circuit 15 and each of the selection transistors 22 are connected together through a corresponding one of output signal lines 23.

The photodiode 17 photoelectrically converts incident light into signal charge. The signal charge produced by the photodiode 17 is transferred to the floating diffusion portion 18 by the transfer transistor 19. The signal charge transferred to the floating diffusion portion 18 is amplified by the amplifier transistor 20, and the amplified signal charge is conveyed through the selection transistor 22 controlled by the vertical shift register 13, and the corresponding output signal line 23 to the output circuit 15. Furthermore, the signal charge conveyed to the output circuit 15 is output from the output terminal 16 through the horizontal shift register 14. A surplus of the charge accumulated in the floating diffusion portion 18 is discharged by the reset transistor 21 having a drain region connected to a power supply line.

In each of the pixels 11, any one of a green filter through which green light transmits, a red filter through which red light transmits, and a blue filter through which blue light transmits may be formed on a corresponding one of the photodiodes 17, and an on-chip microlens may be formed on the filter.

Figure 2:
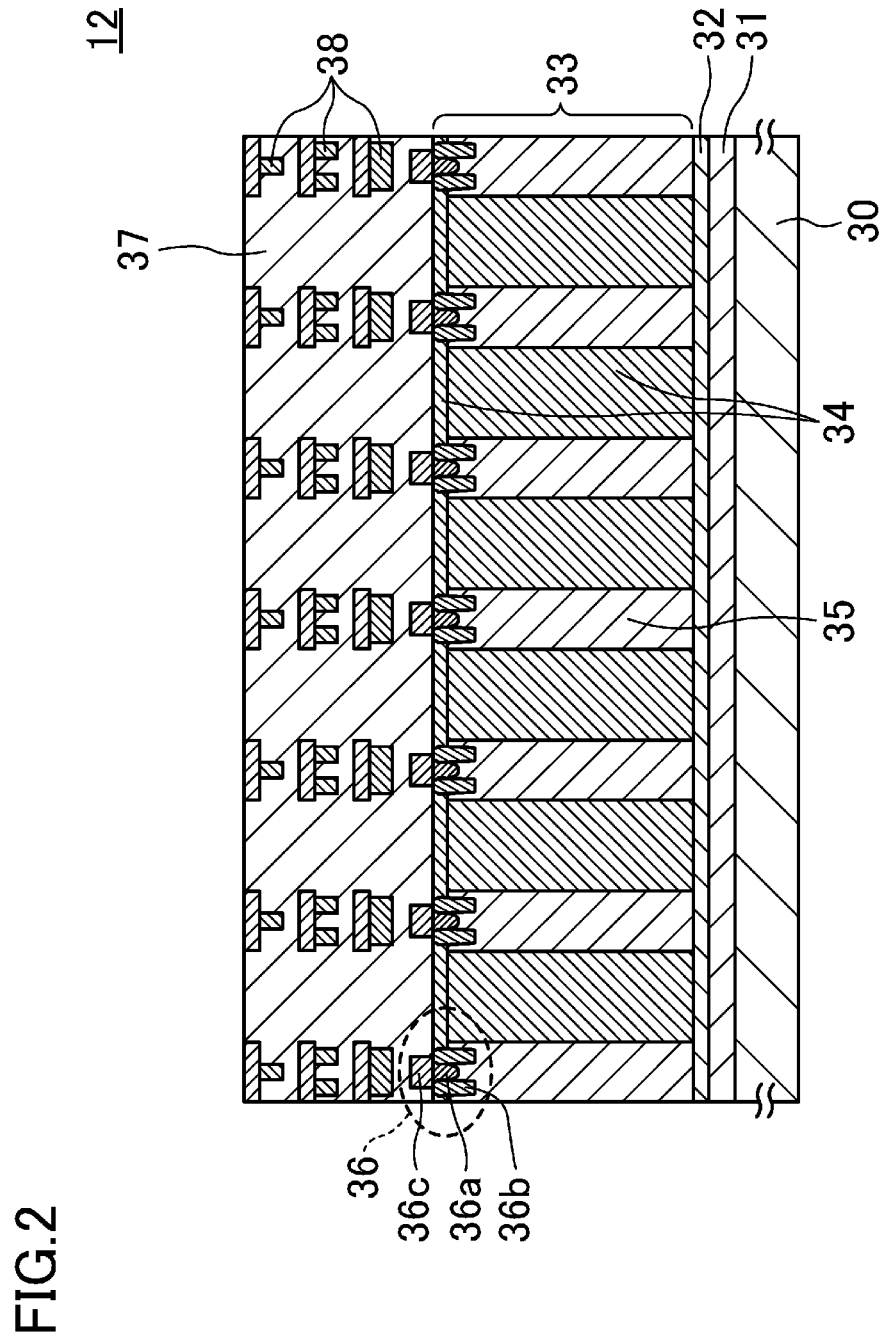
FIG. 2 is a cross-sectional view illustrating the configuration of a pixel array region of the solid-state imaging device according to the first embodiment.

Next, an example cross-sectional configuration of the pixel array region 12 of the solid-state imaging device 10 will be described. As illustrated in FIG. 2, an insulator layer 31, a semiconductor layer 32, and a silicon layer 33 are sequentially formed on a semiconductor substrate 30. A plurality of photodiodes 34 are formed in the silicon layer 33. The photodiodes 34 are example light receiving units, and each extend from a front (upper) surface of the silicon layer 33 to the back (lower) surface thereof. An isolation portion 35 is formed between each adjacent pair of the photodiodes 34. The photodiodes 34 correspond to the photodiodes 17 illustrated in FIG. 1.

Upper portions of the isolation portions 35 of the silicon layer 33 each include a transistor 36 configured to read the charge accumulated in a corresponding one of the photodiodes 34. The transistor 36 is a transistor of a corresponding one of the pixels 11 illustrated in FIG. 1, and is, e.g., the transfer transistor 19, the amplifier transistor 20, or the selection transistor 22. FIG. 2 illustrates the transfer transistor 19 as an example transistor 36. The structure of a MOS transistor is used as the structure of the transistor 36. A shallow trench isolation (STI) region 36b surrounds a diffusion region 36a, and a gate electrode 36c is formed on the diffusion region 36a with a gate oxide film (not shown) interposed therebetween. A multilayer insulating film (a silicon oxide film and a silicon nitride film) 37 covers the gate electrodes 36c, and the insulating film 37 includes multilayer interconnects 38. The transistor 36 is controlled through a corresponding one of the multilayer interconnects 38.

The semiconductor substrate 30 is made of, e.g., silicon, and as long as it ensures a strength high enough to enable the carrying of the semiconductor substrate 30, a glass substrate or a substrate made of another semiconductor material may be used.

The semiconductor layer 32 is made of, e.g., silicon, and has a thickness of about 100-500 nm. The semiconductor layer 32 formed on the insulator layer 31 has many crystal defects, and since the crystal defects are confined in the semiconductor layer 32, this confinement allows the silicon layer 33 formed on the semiconductor layer 32 to have good crystallinity.

The silicon layer 33 has a thickness of about 1-5 μm. In each of the photodiodes 34 formed in the silicon layer 33, a region of the photodiode 34 having a first conductivity type (n-type) (hereinafter referred to as the first-conductivity-type region) is joined to regions thereof having a second conductivity type (p-type) (hereinafter referred to as the second-conductivity-type regions) so as to be interposed therebetween. Specifically, one of the second-conductivity-type (p-type) regions, the first-conductivity-type (n-type) region, and the other second conductivity type (p-type) region are formed in sequential order from the front surface of the silicon layer 33. The impurity concentration in the first-conductivity-type (n-type) region of the photodiode 34 is about $1\times10^{15}$-$1\times10^{18}$ ions/cm$^3$, and the impurity concentration in the second-conductivity-type (p-type) region thereof is about $1\times10^{15}$-$1\times10^{20}$ ions/cm$^3$. The isolation portion 35 formed between each adjacent pair of the photodiodes 34 has a second conductivity type (p-type), and the impurity concentration in the isolation portion 35 is about $1\times10^{17}$-$1\times10^{20}$ ions/cm$^3$.

The second-conductivity-type (p-type) regions between which the first-conductivity-type (n-type) region is interposed are electrically connected to the ground potential (GND) through interconnects. The semiconductor layer 32 has a second conductivity type (p-type), and the impurity concentration in the semiconductor layer 32 is greater than or equal to about $1\times10^{17}$ ions/cm$^3$. The semiconductor layer 32 is preferably a layer made of silicon and having an impurity concentration of about $1\times10^{17}$-$1\times10^{20}$ ions/cm$^3$. Thus, noise charge resulting from the crystal defects confined in the semiconductor layer 32 after the formation of the silicon layer 33 does not contribute to the output signal charge.

The insulator layer 31 is, e.g., a silicon oxide film, a silicon nitride film, or a metal oxide film. The insulator layer 31 is modified by implanting, e.g., boron ions, as p-type impurities, into the insulator layer 31, and the concentration of the p-type impurities in the insulator layer 31 is greater than or equal to about $1\times10^{10}$ ions/cm$^2$, and is preferably about $1\times10^{10}$ ions/cm$^2$. Holes in the insulator layer 31 are diffused into the semiconductor layer 32 on the insulator layer 31, thereby removing the noise charge resulting from the confined crystal defects.

Figure 3:
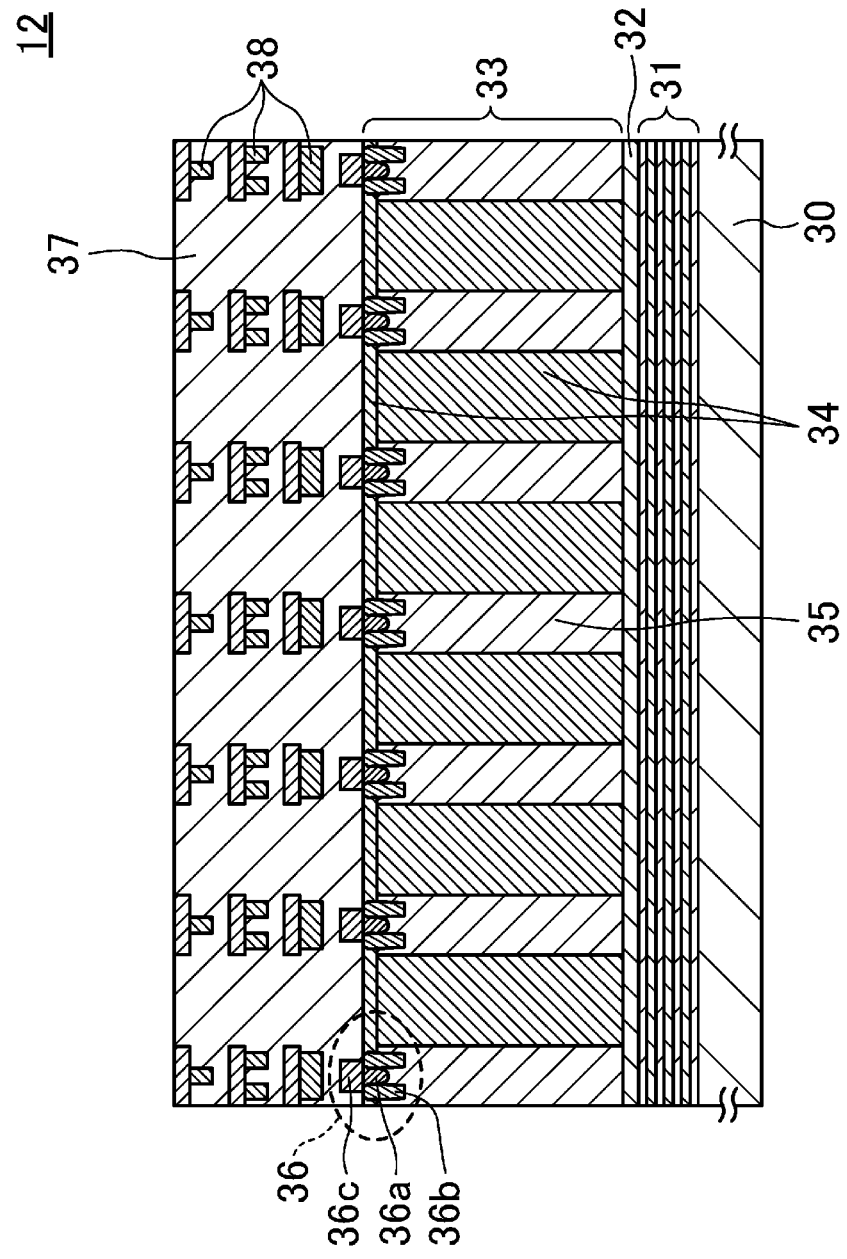
FIG. 3 is a cross-sectional view illustrating the configuration of a pixel array region of a solid-state imaging device according to a variation of the first embodiment.

In this embodiment, the single insulator layer 31 is formed on the semiconductor substrate 30. However, as illustrated in FIG. 3, in a variation of the first embodiment, seven insulator layers 31, for example, may be formed, and at least one insulator layer merely needs to be formed. When the insulator layer 31 is a multilayer film, different films, such as a silicon oxide film, a silicon nitride film, and a metal oxide film, may be combined.

The refractive index of the semiconductor layer 32 made of, e.g., silicon is about 3.8-5.6 in the wavelength range of visible light. When the insulator layer 31 is made of, e.g., a silicon oxide film, its refractive index is about 1.4-1.5 in the wavelength range of visible light. When the insulator layer 31 is made of a silicon nitride film, its refractive index is about 1.9-2.1 in the wavelength range of visible light. When the insulator layer 31 is a titanium oxide film that is a metal oxide film, its refractive index is about 2.7-3.3 in the wavelength range of visible light, and is lower than that of the semiconductor layer 32 made of silicon. Here, instead of the above-described materials, a combination of materials allowing the refractive index of the insulator layer 31 to be lower than that of the semiconductor layer 32 may be used.

Figure 4:
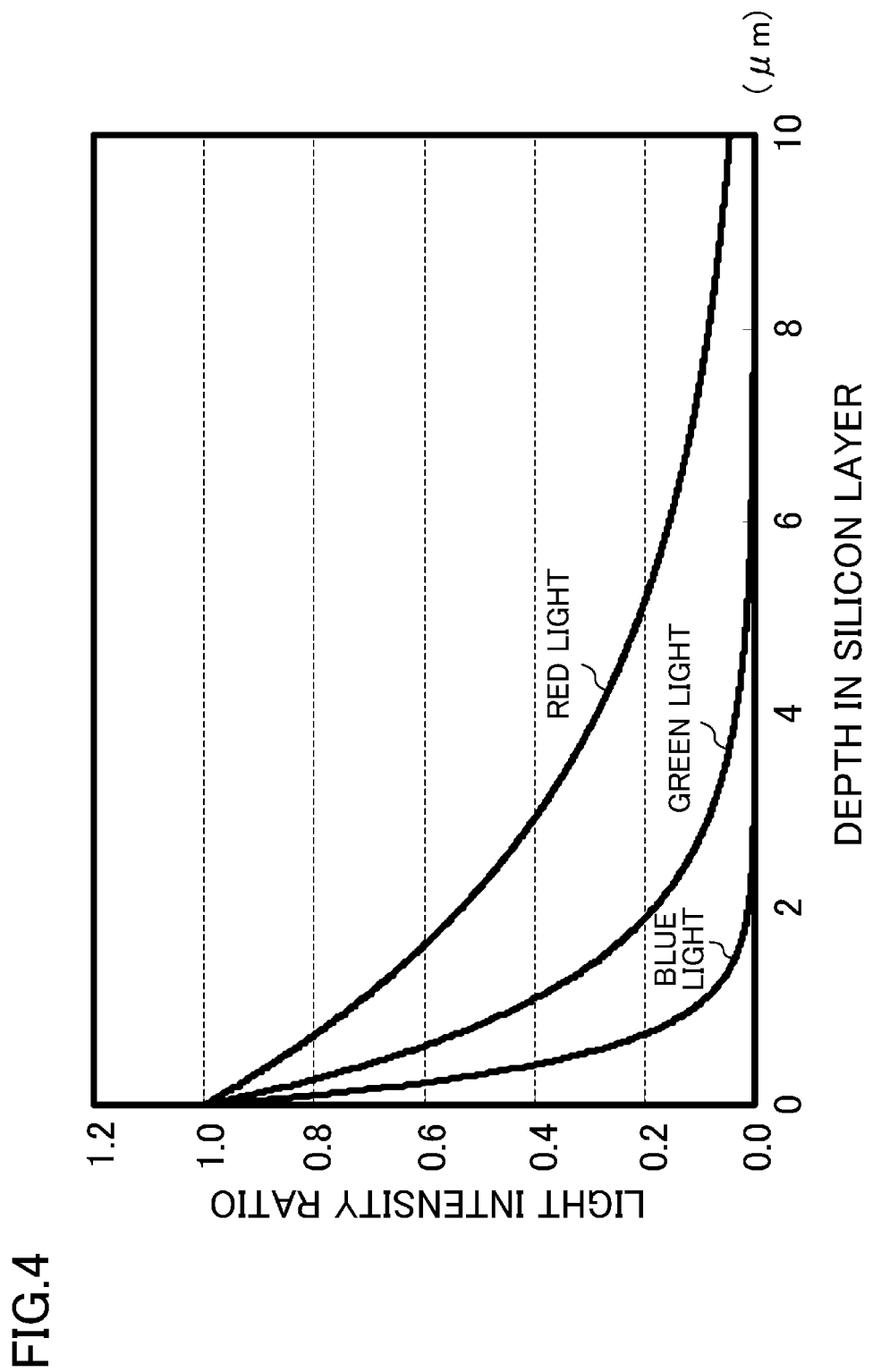
FIG. 4 is a graph illustrating the relationship between a depth in a silicon layer and the light intensity ratio.

Next, the relationship between a depth in the silicon layer 33 and the intensity ratios of light having different wavelengths at the depth will be described. Here, each of the light intensity ratios is determined by (the light intensity I at each of depths in the silicon layer 33)/(the light intensity $I_0$ on the upper surface of the silicon layer 33). As illustrated in FIG. 4, the intensity ratio of short wavelength light approaches zero in a shallow region of the silicon layer 33. The reason for this is that the absorption coefficient of the silicon layer 33 for short wavelength light is high, and short wavelength light is substantially totally absorbed in the shallow region of the silicon layer 33. In contrast, the absorption coefficient of the silicon layer 33 for long wavelength light is low, and long wavelength light reaches a deep region of the silicon layer 33 without being absorbed. For example, when the thickness of the silicon layer 33 is 2.4 µm, 99.8% of blue light having a wavelength of about 450 nm is absorbed in the silicon layer 33, 78.9% of green light having a wavelength of about 550 nm is absorbed in the silicon layer 33, and 47.9% of red light having a wavelength of about 650 nm is absorbed in the silicon layer 33. Unabsorbed light does not contribute to signal output (sensitivity).

In the solid-state imaging device of this embodiment, the difference in refractive index between the insulator layer 31 and the semiconductor layer 32 allows light that has reached the insulator layer 31 to be reflected off the interface therebetween, and the reflected light is absorbed in the photodiodes 34, thereby enhancing the sensitivity. For example, when the solid-state imaging device includes the single-layer insulator layer 31 as illustrated in FIG. 2, and the insulator layer 31 is a silicon oxide film having a thickness of 300 nm, the reflectivity of the interface between the insulator layer 31 and the semiconductor layer 32 for green light is 58.7%, and the reflectivity thereof for red light is 49.7%. The reflection enhances the sensitivity to green light by 5-10%, and enhances the sensitivity to red light by 10-15% although depending also on the thickness of the silicon layer 33 and other structures. Furthermore, when a silicon oxide film, a metal oxide film, and other films are used as the insulator layer 31 to form a layered structure, this can also enhance the sensitivity. For example, assume that the insulator layer 31 has a seven-layer structure in which a titanium oxide film (A), a silicon oxide film (B), a titanium oxide film (C), a silicon oxide film (D), a titanium oxide film (E), a silicon oxide film (F), and a titanium oxide film (G) are sequentially deposited, the thickness of each of the titanium oxide films (A), (C), (E), and (G) is about 45-55 nm, the thickness of each of the silicon oxide films (B) and (F) is about 85-95 nm, and the thickness of the silicon oxide film (D) is about 130-140 nm. In this case, the reflectivity of the interface for red light is 85-95%, and thus, the sensitivity can be further enhanced.

The insulator layer 31 having the seven-layer structure was described as an example. However, reflector structures suitable for light having different wavelengths can be formed by varying the structure and thickness of the insulator layer 31. This can enhance the sensitivity, and can also prevent a flare (ghosting) caused by re-reflection of reflected light off the lens surface.

The site front least squares range (SFQR) of the interface between the insulator layer 31 and the semiconductor layer 32 is preferably equal to or less than about 0.1 µm. The SFQR is determined by obtaining a plurality of rectangular samples having predetermined sizes, and calculating the sum of the absolute values of the maximum deviations, which have been determined by a least-squares method, of sites of each of the samples from the reference plane, and the SFQR is a typical indicator indicating the flatness of a wafer. When the SFQR of the interface between the insulator layer 31 and the semiconductor layer 32 is equal to or less than 0.1 µm, this can prevent irregular reflections of light off the interface, thereby preventing the optical crosstalk due to light leaking into a pixel adjacent to a pixel entered by the light, and enhancing the sensitivity.

According to the solid-state imaging device of the first embodiment, defects in the photoelectric converter, such as white blemishes, can be reduced, thereby obtaining a high-sensitivity solid-state imaging device exhibiting low optical crosstalk.

Second Embodiment

A solid-state imaging device according to a second embodiment will be described with reference to FIG. 5. In this embodiment, explanation of features similar to those of the first embodiment will be simplified or omitted, and only the difference between the first and second embodiments will be described in detail.

Figure 5:
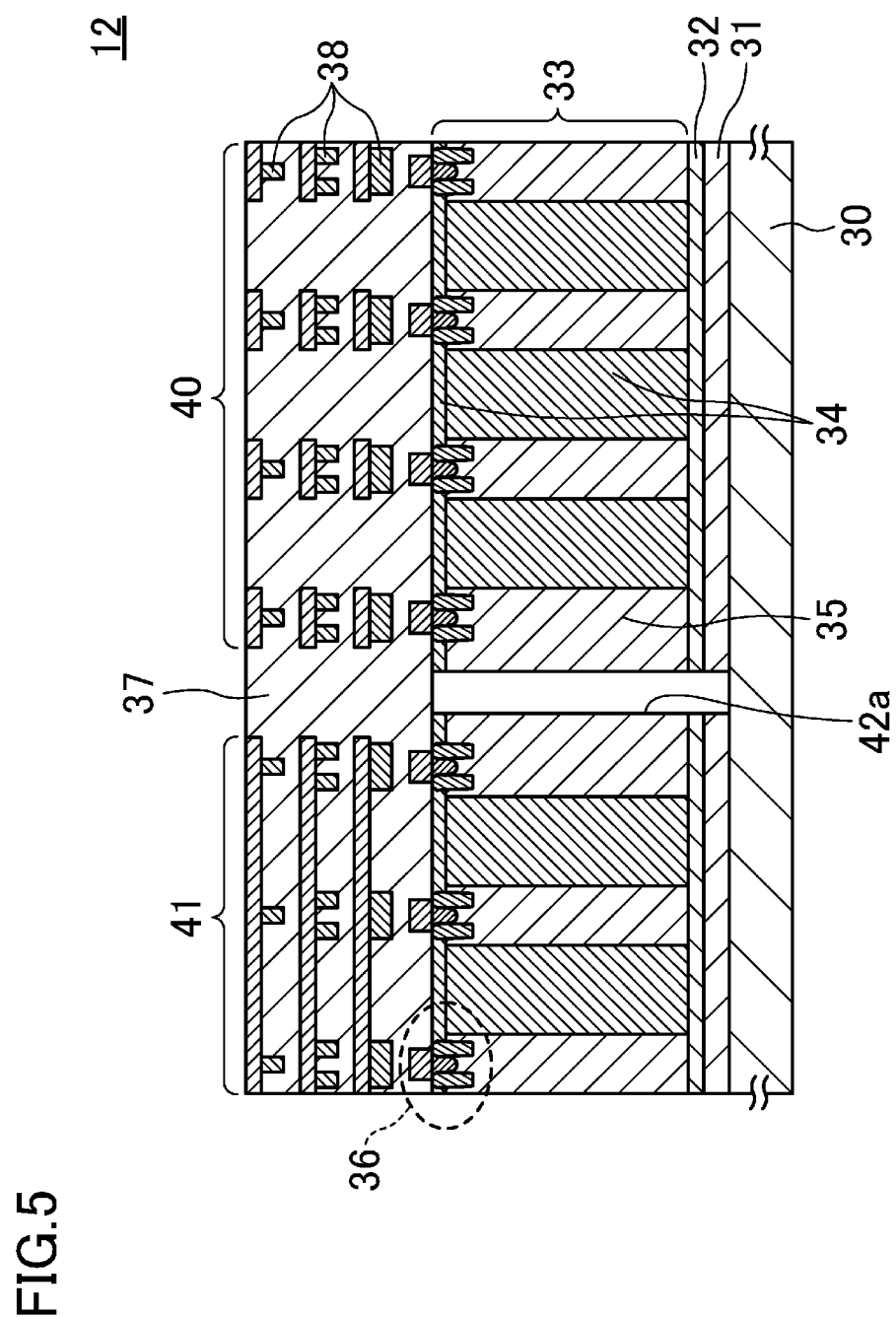
FIG. 5 is a cross-sectional view illustrating the configuration of a pixel array region of a solid-state imaging device according to a second embodiment.

As illustrated in FIG. 5, a pixel array region 12 includes an imaging area 40 on which light is incident, and an optical black area 41 shielded from light to prevent light from being incident on the optical black area 41. A groove 42a is formed between the imaging area 40 and the optical black area 41 to pass through a silicon layer 33, a semiconductor layer 32, and an insulator layer 31 and expose a part of the front surface of a semiconductor substrate 30. The groove 42a may be an empty space, or may be filled with a silicon oxide film, a polysilicon film, or another film.

When light that has been reflected off the interface between a portion of the insulator layer 31 and a portion of the semiconductor layer 32 both in the imaging area 40 entered by the light leaks into the optical black area 41, a reference signal changes, and noise is caused to degrade image quality. When the groove 42a is formed, a difference in refractive index between the silicon layer 33 and the groove 42a allows obliquely reflected light off the interface between the insulator layer 31 and the semiconductor layer 32 to be again reflected off the interface between the silicon layer 33 and the groove 42a, thereby preventing the obliquely reflected light from leaking into the optical black area 41. Furthermore, light that has been reflected off the interface between the insulator layer 31 and the semiconductor substrate 30 can be prevented from leaking into the optical black area 41 after propagating through the insulator layer 31.

According to the solid-state imaging device of the second embodiment, defects in a photoelectric converter, such as white blemishes, can be reduced, thereby obtaining a high-sensitivity solid-state imaging device exhibiting low optical crosstalk. Furthermore, noise caused by a change in the reference signal can be prevented.

Third Embodiment

Next, a solid-state imaging device according to a third embodiment will be described with reference to FIG. 6. In this embodiment, explanation of features similar to those of the first embodiment will be simplified or omitted, and only the difference between the first and third embodiments will be described in detail.

Figure 6:
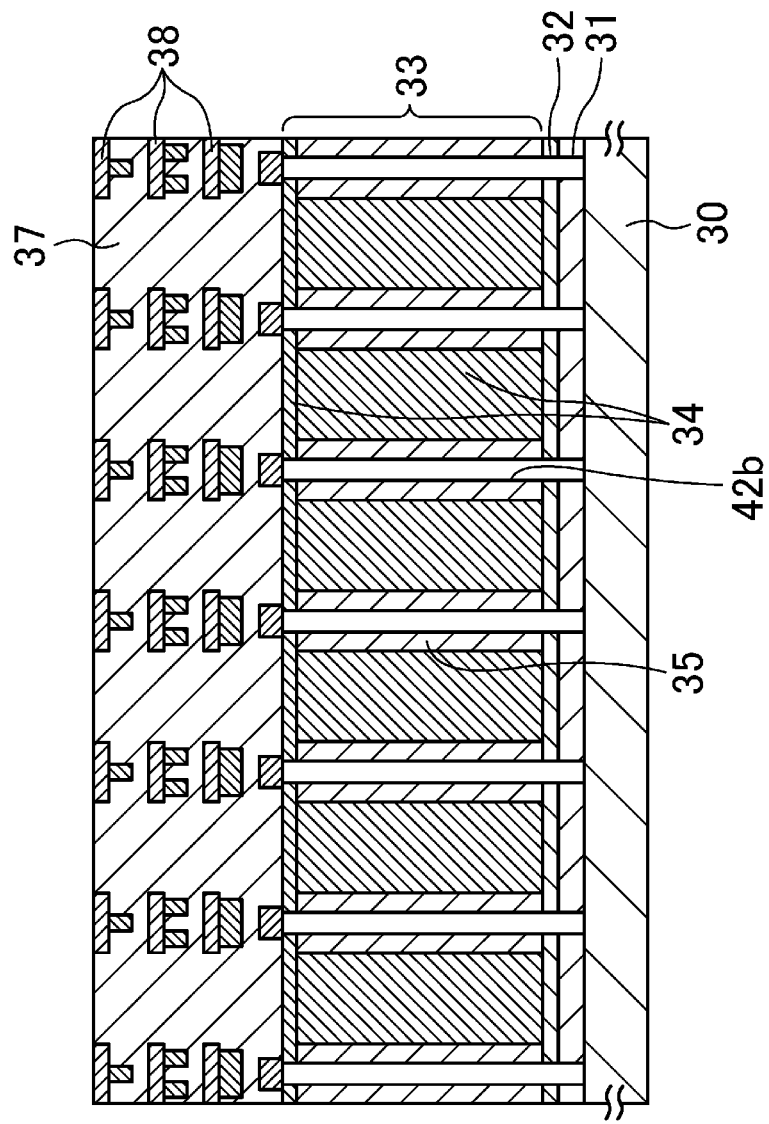
FIG. 6 is a cross-sectional view illustrating the configuration of a pixel array region of a solid-state imaging device according to a third embodiment.

As illustrated in FIG. 6, a pixel array region 12 includes a plurality of photodiodes 34, and a groove 42b is formed between each adjacent pair of the photodiodes 34 to pass through a silicon layer 33, a semiconductor layer 32, and an insulator layer 31 and expose parts of the front surface of a semiconductor substrate 30. The groove 42b may be an empty space, or may be filled with a silicon oxide film, a polysilicon film, or another film. As illustrated in FIG. 6, the groove 42b is preferably formed at a location that does not affect the characteristics of, e.g., a corresponding transfer transistor.

Since, in this embodiment, the groove 42b is formed between each adjacent pair of the photodiodes 34, a difference in refractive index between the silicon layer 33 and the groove 42b allows obliquely reflected light off the interface between the insulator layer 31 and the semiconductor layer 32 to be again reflected off the interface between the silicon layer 33 and the groove 42, thereby preventing the obliquely reflected light from leaking into the photodiode 34 of each of pixels adjacent to a pixel entered by light.

According to the solid-state imaging device of the third embodiment, defects in a photoelectric converter, such as white blemishes, can be reduced, thereby obtaining a high-sensitivity solid-state imaging device exhibiting low optical crosstalk.

(First Variation of Third Embodiment)

A solid-state imaging device according to a first variation of the third embodiment will be described with reference to FIG. 7. In this variation, explanation of features similar to those of each of the first and third embodiments will be simplified or omitted, and only the difference between each of the first and third embodiments and the first variation will be described in detail.

Figure 7:
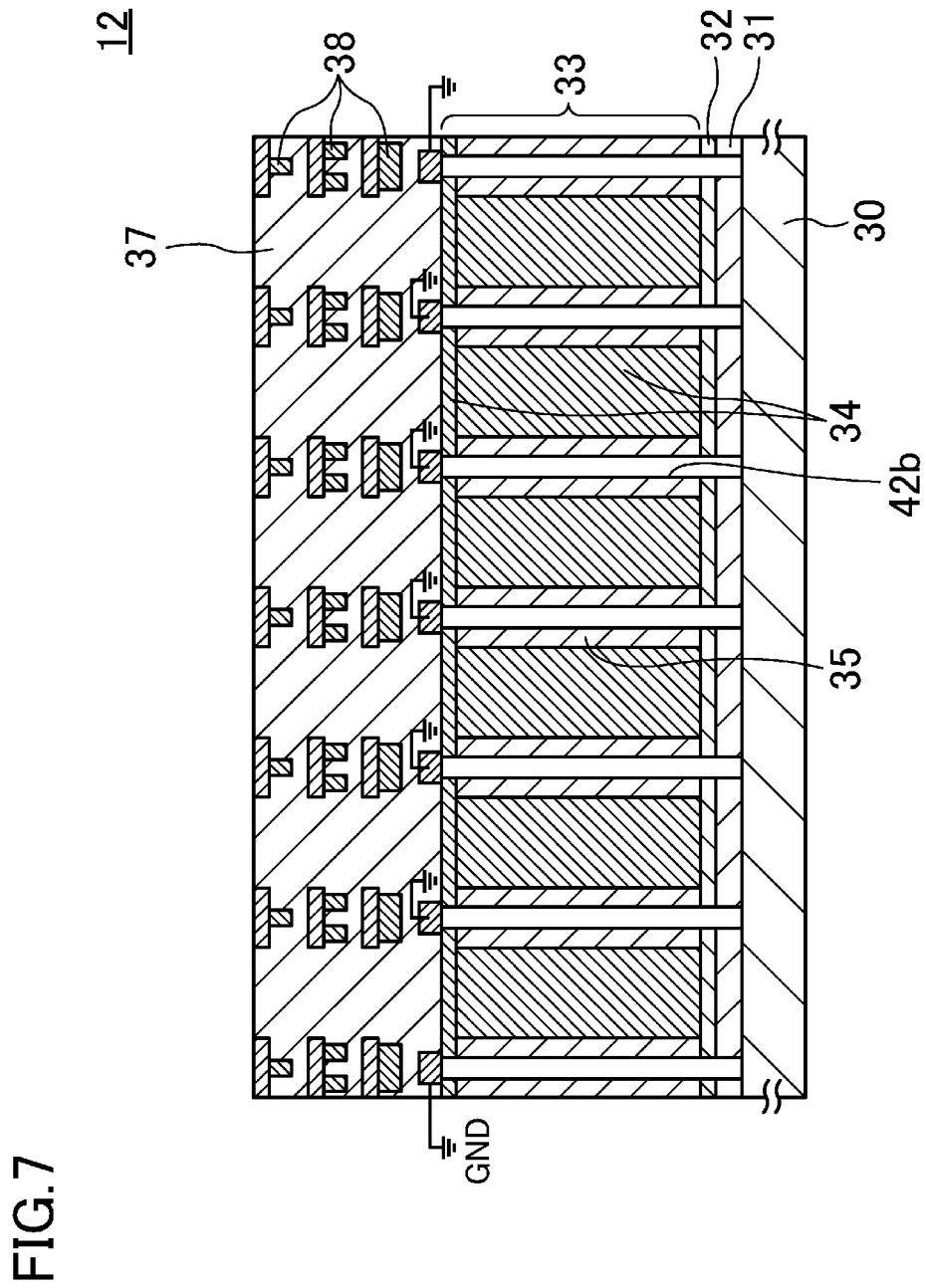
FIG. 7 is a cross-sectional view illustrating the configuration of a pixel array region of a solid-state imaging device according to a first variation of the third embodiment.

As illustrated in FIG. 7, a pixel array region 12 includes a plurality of photodiodes 34, and a groove 42b is formed between each adjacent pair of the photodiodes 34 to pass through a silicon layer 33, a semiconductor layer 32, and an insulator layer 31 and expose parts of the front surface of a semiconductor substrate 30. The groove 42b is filled with a polysilicon film. The semiconductor layer 32 and each of isolation portions 35 are fixed to GND through the polysilicon film with which the corresponding groove 42b is filled, and a well contact formed in a corresponding one of pixels. Although the semiconductor layer 32 and the isolation portion 35 are fixed to GND through the well contact formed in the corresponding pixel, they may be fixed to GND through a well contact formed outside the pixel array region or the back surface of the semiconductor substrate 30.

Charge generated in the semiconductor layer 32 and the isolation portions 35 to cause noise is removed from regions of the semiconductor layer 32 and the isolation portion 35 fixed to GND to prevent the charge from leaking into the photodiodes 34.

According to the solid-state imaging device of the first variation of the third embodiment, defects in a photoelectric converter, such as white blemishes, can be reduced, thereby obtaining a high-sensitivity solid-state imaging device exhibiting low optical crosstalk. Furthermore, noise charge generated in, e.g., the semiconductor layer can be removed.

(Second Variation of Third Embodiment)

A solid-state imaging device according to a second variation of the third embodiment will be described with reference to FIG. 8. In this variation, explanation of features similar to those of each of the first and third embodiments will be simplified or omitted, and only the difference between each of the first and third embodiments and the second variation will be described in detail.

Figure 8:
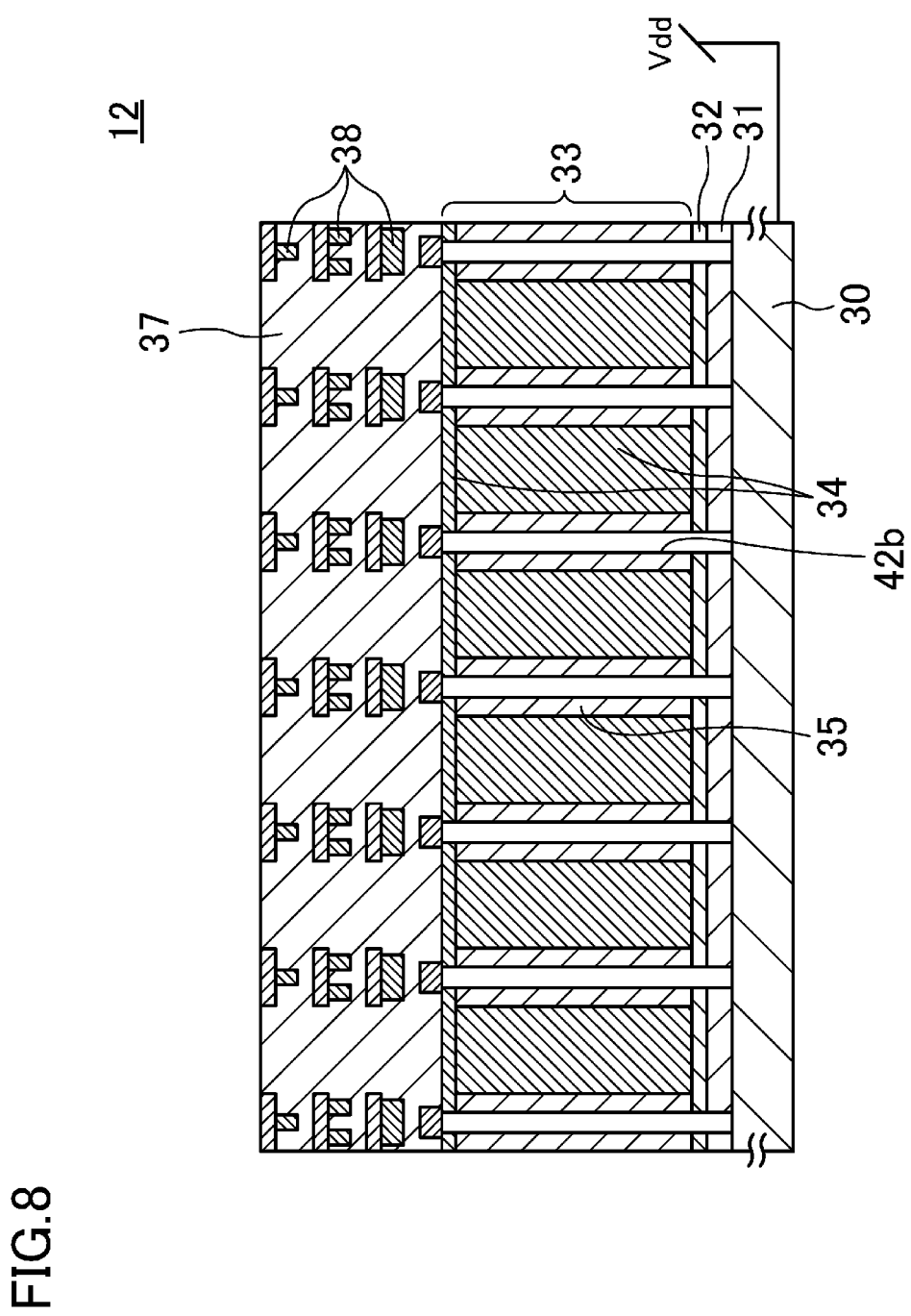
FIG. 8 is a cross-sectional view illustrating the configuration of a pixel array region of a solid-state imaging device according to a second variation of the third embodiment.

As illustrated in FIG. 8, a pixel array region 12 includes a plurality of photodiodes 34, and a groove 42b is formed between each adjacent pair of the photodiodes 34 to pass through a silicon layer 33, a semiconductor layer 32, and an insulator layer 31 and expose parts of the front surface of a semiconductor substrate 30. The groove 42b is filled with a polysilicon film. The semiconductor substrate 30 is an n-type semiconductor substrate, and its potential is fixed to a power supply potential (Vdd). Although, in this variation, the potential of the semiconductor substrate 30 is fixed to the potential Vdd through the back surface of the semiconductor substrate 30, it may be fixed to the potential Vdd through a well contact formed in the front surface of a region of the semiconductor substrate 30 outside the pixel array region 12.

Thus, the photodiodes 34 can each have an overflow drain structure in which a surplus of generated charge is discharged through the polysilicon film to the semiconductor substrate 30.

According to the solid-state imaging device of the second variation of the third embodiment, defects in a photoelectric converter, such as white blemishes, can be reduced, thereby obtaining a high-sensitivity solid-state imaging device exhibiting low optical crosstalk. Furthermore, a surplus of charge in each of the photodiodes can be discharged.

(Third Variation of Third Embodiment)

A solid-state imaging device according to a third variation of the third embodiment will be described with reference to FIG. 9. In this variation, explanation of features similar to those of each of the first and third embodiments will be simplified or omitted, and only the difference between each of the first and third embodiments and the third variation will be described in detail.

Figure 9:
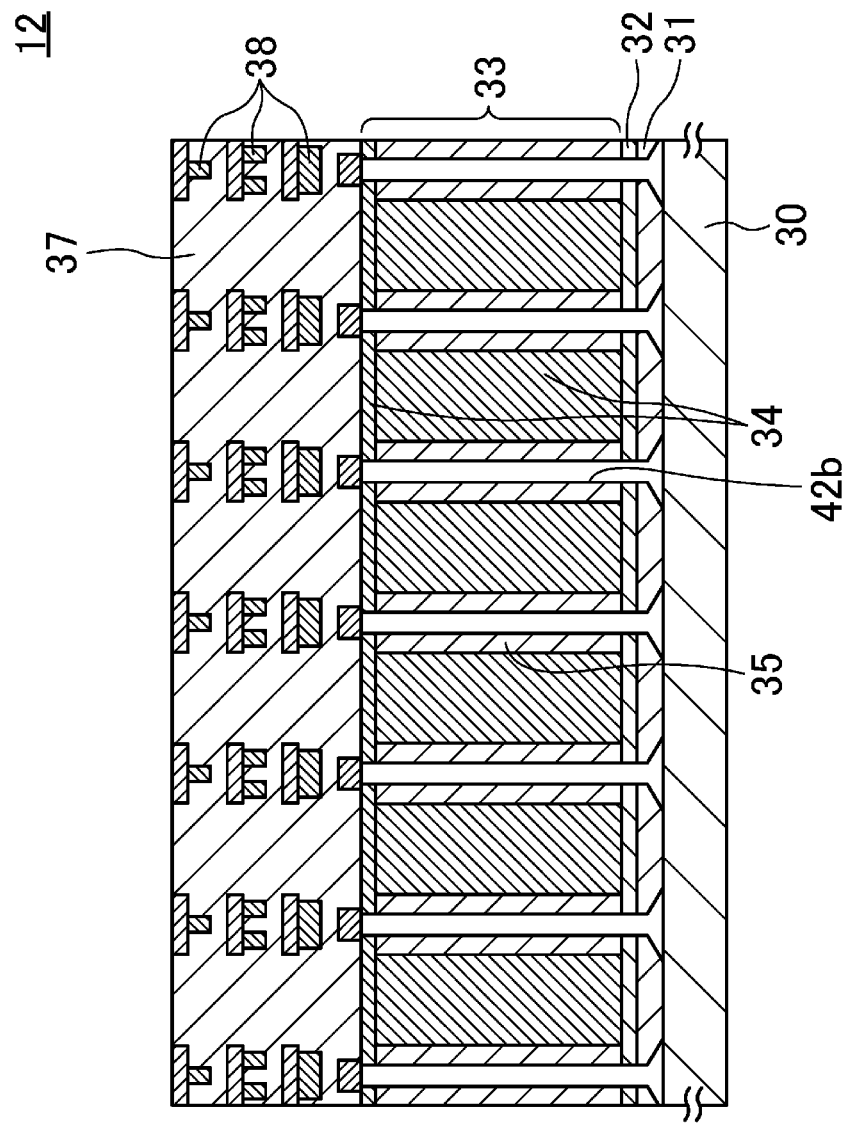
FIG. 9 is a cross-sectional view illustrating the configuration of a pixel array region of a solid-state imaging device according to a third variation of the third embodiment.

As illustrated in FIG. 9, a pixel array region 12 includes a plurality of photodiodes 34, and a groove 42b is formed between each adjacent pair of the photodiodes 34 to pass through a silicon layer 33, a semiconductor layer 32, and an insulator layer 31 and expose parts of the front surface of a semiconductor substrate 30. The width of the groove 42b increases from the semiconductor layer 32 to the semiconductor substrate 30.

Thus, light that has entered each of the photodiodes 34 is reflected to concentrate on the photodiode 34 entered by the light without being reflected toward some of the photodiodes 34 adjacent to the photodiode 34 entered by the light. This can prevent optical crosstalk, and can enhance the sensitivity.

According to the solid-state imaging device of the third variation of the third embodiment, defects in a photoelectric converter, such as white blemishes, can be reduced, thereby obtaining a high-sensitivity solid-state imaging device exhibiting low optical crosstalk.

Fourth Embodiment

A solid-state imaging device according to a fourth embodiment will be described with reference to FIG. 10. In this embodiment, explanation of features similar to those of the first embodiment will be simplified or omitted, and only the difference between the first and fourth embodiments will be described in detail.

Figure 10:
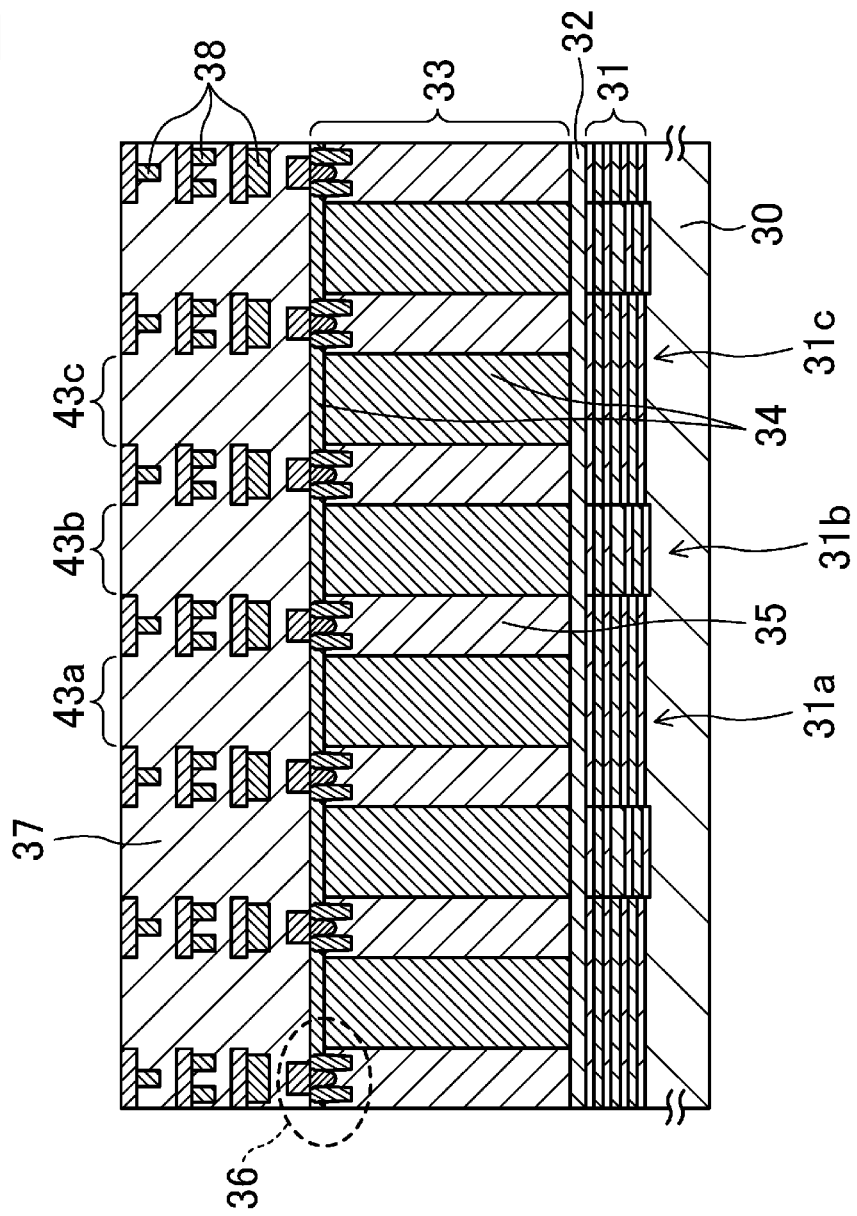
FIG. 10 is a cross-sectional view illustrating the configuration of a pixel array region of a solid-state imaging device according to a fourth embodiment.

As illustrated in FIG. 10, a pixel array region 12 includes a plurality of photodiodes 34. Light entering each of the photodiodes 34 is determined by the characteristics of a color filter formed in a corresponding one of pixels. In this embodiment, for example, color filters arranged in a Bayer pattern are used. On a specific line of the Bayer pattern, red light is incident on a pixel 43b adjacent to a pixel 43a on which green light is incident, and green light is incident on a pixel 43c adjacent to the pixel 43b. When the pixels each include an insulator layer 31 having reflection properties suitable for light incident on the pixel, this can further enhance the sensitivity to light having different wavelengths.

The pixel 43b on which red light is incident includes an insulator layer 31b having a seven-layer structure of a titanium oxide film (A), a silicon oxide film (B), a titanium oxide film (C), a silicon oxide film (D), a titanium oxide film (E), a silicon oxide film (F), and a titanium oxide film (G). The thickness of each of the titanium oxide films (A), (C), (E), and (G) is about 45-55 nm, the thickness of each of the silicon oxide films (B) and (F) is about 85-95 nm, and the thickness of the silicon oxide film (D) is about 130-140 nm. In this case, the reflectivity of the interface between the insulator layer 31b and the semiconductor layer 32 for red light having a wavelength of about 630-660 nm is 85-95%. The pixels 43a and 43c on which green light is incident include insulator layers 31a and 31c, respectively, having a seven-layer structure of a titanium oxide film (A), a silicon oxide film (B), a titanium oxide film (C), a silicon oxide film (D), a titanium oxide film (E), a silicon oxide film (F), and a titanium oxide film (G). The thickness of each of the titanium oxide films (A), (C), (E), and (G) is about 45-55 nm, the thickness of each of the silicon oxide films (B) and (F) is about 85-95 nm, and the thickness of the silicon oxide film (D) is about 40-50 nm. In this case, the reflectivity of the interface between each of the insulator layers 31a and 31c and the semiconductor layer 32 for green light having a wavelength of about 530-550 nm is 80-95%.

According to the solid-state imaging device of the fourth embodiment, defects in a photoelectric converter, such as white blemishes, can be reduced, thereby obtaining a high-sensitivity solid-state imaging device exhibiting low optical crosstalk.

Next, a method for fabricating a solid-state imaging device according to each of the first through fourth embodiments will be described with reference to FIGS. 11-13.

Figure 11A:
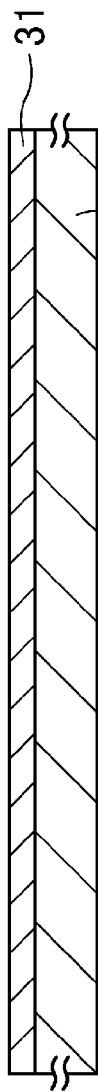
FIGS. 11A-11C are cross-sectional views sequentially illustrating process steps in a method for fabricating a solid-state imaging device according to each of the first through fourth embodiments.

First, as illustrated in FIG. 11A, an insulator layer 31 made of any one of a silicon oxide film, a silicon nitride film, and a metal oxide film is formed on a semiconductor substrate 30 by, e.g., thermal oxidation, chemical vapor deposition (CVD), or sputtering. Although FIG. 11A illustrates the single insulator layer 31, an insulator layer having a layered structure may be formed. The insulator layer 31 is modified by implanting, for example, boron ions, as p-type impurities, into the insulator layer 31, and the concentration of the p-type impurities in the insulator layer 31 is about $1\times10^{10}$ ions/cm$^2$.

Figure 11B:
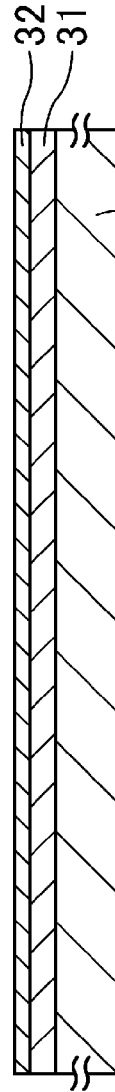

Next, as illustrated in FIG. 11B, a semiconductor layer 32 is formed on the insulator layer 31. Here, the semiconductor layer 32 may be formed on the insulator layer 31 by epitaxial deposition or CVD. Alternatively, another semiconductor substrate may be bonded onto the insulator layer 31, and then, the semiconductor layer 32 may be formed by reducing the thickness of the another semiconductor substrate. Before the formation of the semiconductor layer 32, a surface of the insulator layer 31 on which the semiconductor layer 32 is to be formed is preferably polished by chemical mechanical polishing (CMP) such that the SFQR of the interface between the insulator layer 31 and the semiconductor layer 32 is equal to or less than 0.1 μm. Alternatively, the insulator layer 31 may be reflowed by high-temperature annealing. When the another semiconductor substrate is used to form the semiconductor layer 32, a surface of the another semiconductor substrate being in contact with the insulator layer 31 is preferably polished by CMP. When, like the solid-state imaging device of the fourth embodiment, pixels include portions of the insulator layer 31 having different thicknesses, alignment marks are formed on the semiconductor substrate 30, and only portions of the insulator layer 31 that correspond to some of the pixels and need to be controlled in thickness are patterned by lithography. Thereafter, the insulator layer 31 having desired thicknesses can be formed by wet etching and dry etching. Ions are implanted, as impurities, into the semiconductor layer 32, thereby allowing the semiconductor layer 32 to have a second conductivity type (p-type). The impurity concentration in the semiconductor layer 32 is about $1\times10^{17}$-$1\times10^{20}$ ions/cm$^3$.

Figure 11C:
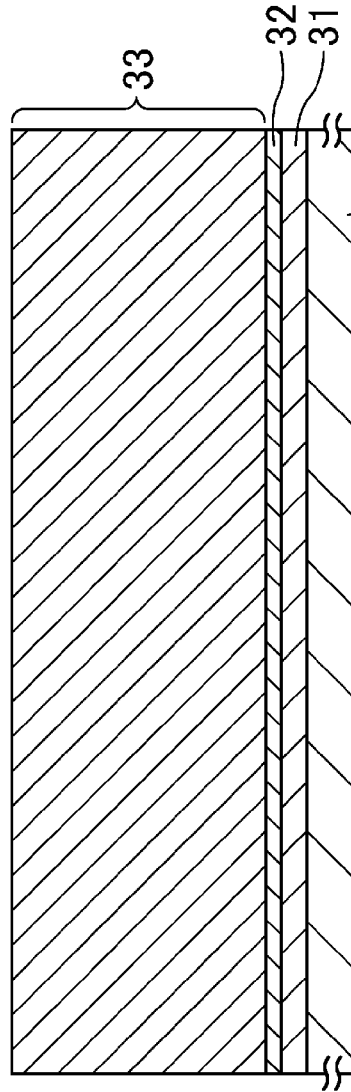

Next, as illustrated in FIG. 11C, a silicon layer 33 is formed on the semiconductor layer 32 by, e.g., epitaxial deposition.

Next, as illustrated in FIG. 12A, the silicon layer 33 includes photodiodes 34, isolation portions 35, and transistors 36 formed by a known process. Thereafter, a multilayer insulating film is formed on the silicon layer 33, and multilayer interconnects are formed in the multilayer insulating film, thereby fabricating a solid-state imaging device according to each of the first and fourth embodiments.

To fabricate a solid-state imaging device according to each of the second and third embodiments and the variations of the third embodiment, grooves 42b are formed at desired locations to pass through the silicon layer 33, the semiconductor layer 32, and the insulator layer 31 and expose parts of the front surface of the semiconductor substrate 30 as illustrated in FIG. 12B. However, the grooves 42b are preferably formed at locations that do not affect the characteristics of the corresponding transistors 36. Although, in FIG. 12B, the grooves 42b are each formed between a corresponding adjacent pair of the photodiodes 34 like the solid-state imaging device of each of the third embodiment and the variations of the third embodiment, the locations of the grooves 42b are not limited to the above locations. To fabricate the solid-state imaging device of the second embodiment, a groove is formed between an imaging area and an optical black area. A pattern is formed by, e.g., lithography to open only a region between each adjacent pair of the photodiodes 34, and corresponding portions of the silicon layer 33, corresponding portions of the semiconductor layer 32, and corresponding portions of the insulator layer 31 are removed by dry etching, thereby forming the grooves 42b. Etching with, e.g., a sulfur hexafluoride ($SF_6$) gas can be used to remove the portions of the silicon layer 33 and the portions of the semiconductor layer 32. The insulator layer 31 can be etched using, e.g., a carbon tetrafluoride ($CF_4$) gas to remove the portions of the insulator layer 31. Such a structure of each of the grooves 42b as illustrated in the third variation of the third embodiment can be formed by using the difference in etch rate among constituent layers of the insulator layer 31. For example, when the insulator layer 31 has a double-layer structure, a portion of the insulator layer 31 near the semiconductor substrate 30 is made of a thermal silicon oxide film, and a portion thereof near the semiconductor layer 32 is made of a silicon nitride film, dilute hydrofluoric acid can be used. The etch rate of the thermal silicon oxide film in dilute hydrofluoric acid (water:hydrofluoric acid=100:1) is about five times as high as that of the silicon nitride film therein, and thus, when dilute hydrofluoric acid is used to etch the thermal silicon oxide film and the silicon nitride film by wet etching, the width of a bottom portion of each of the grooves 42b increases. The grooves 42b may be each an empty space, or may be each filled with, e.g., a silicon oxide film or a polysilicon film. To fabricate the solid-state imaging device according to the first variation of the third embodiment, the grooves 42b are each filled with a polysilicon film, the semiconductor layer 32 and the isolation portions 35 are fixed to GND through the corresponding polysilicon films and well contacts formed in corresponding pixels by a known process. To fabricate the solid-state imaging device according to the second variation of the third embodiment, the grooves 42b are each filled with a polysilicon film, an n-type semiconductor substrate is used as the semiconductor substrate 30, and the potential of the semiconductor substrate 30 is fixed to the potential Vdd.

Figure 13:
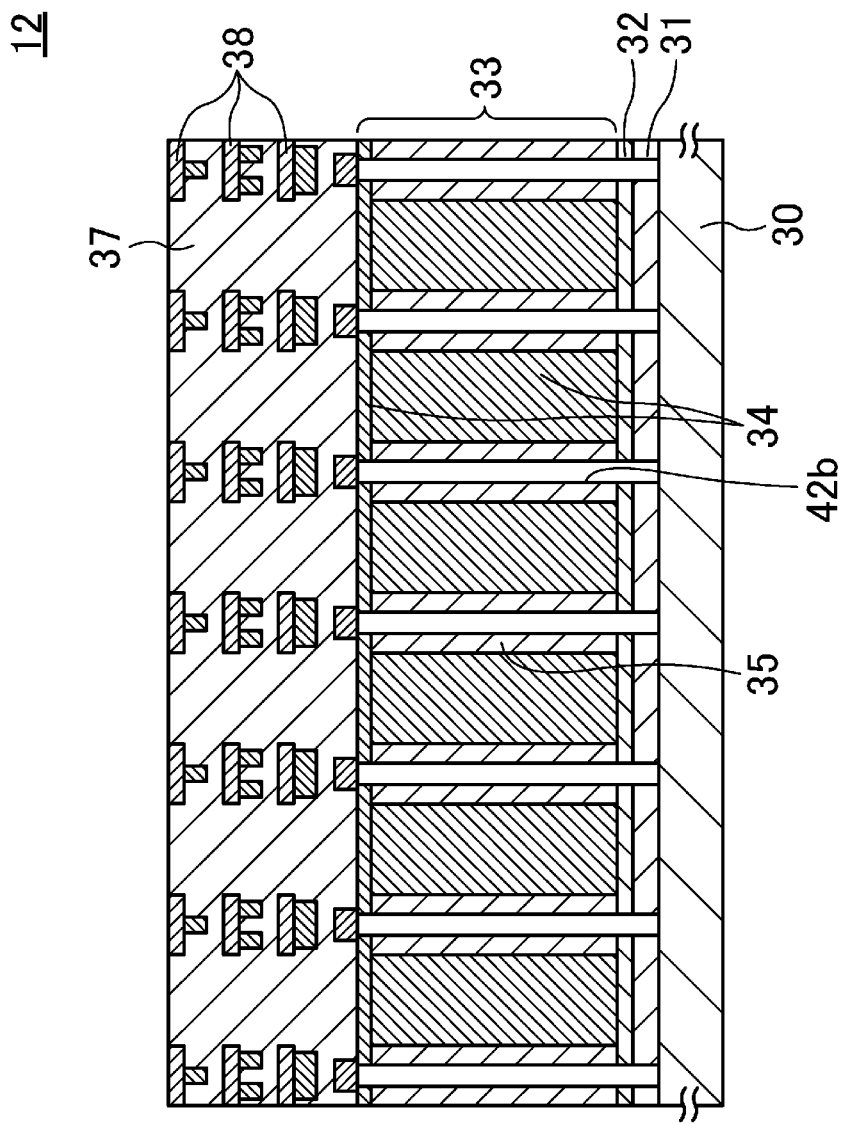
FIG. 13 is a cross-sectional view illustrating another process step in the method for fabricating a solid-state imaging device according to each of the first through fourth embodiments.

Next, as illustrated in FIG. 13, a multilayer insulating film 37 is formed on the silicon layer 33 by, e.g., CVD, and multilayer interconnects 38 are formed in the multilayer insulating film 37.

According to the method for fabricating a solid-state imaging device of each of the first through fourth embodiments, defects in a photoelectric converter, such as white blemishes, can be reduced, thereby obtaining a high-sensitivity solid-state imaging device exhibiting low optical crosstalk.

Fifth Embodiment

A solid-state imaging device according to a fifth embodiment will be described with reference to FIG. 14. In this embodiment, explanation of features similar to those of the first embodiment will be simplified or omitted, and only the difference between the first and fifth embodiments will be described in detail.

Figure 14:
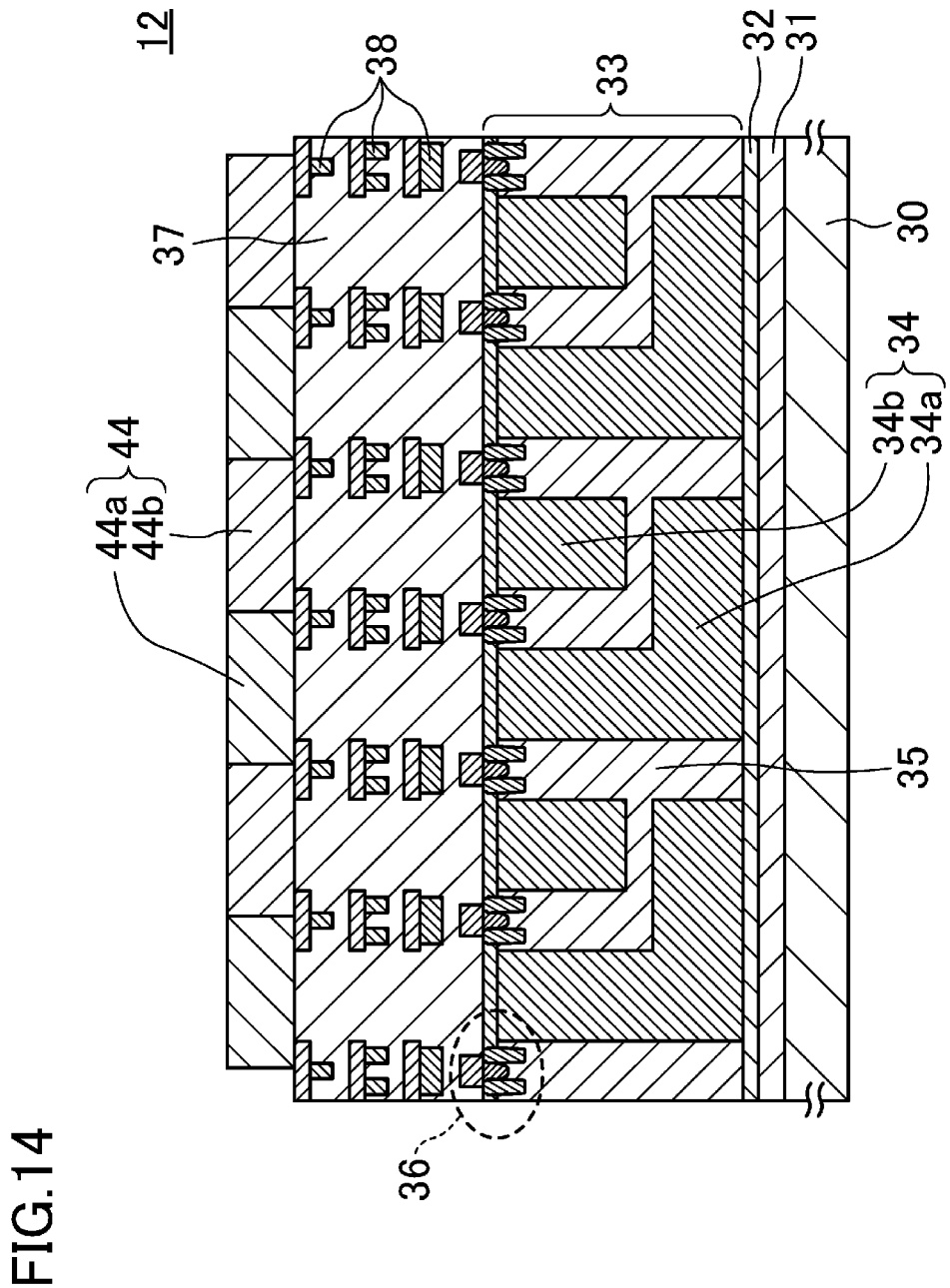
FIG. 14 is a cross-sectional view illustrating the configuration of a pixel array region of a solid-state imaging device according to a fifth embodiment.
Figure 15:
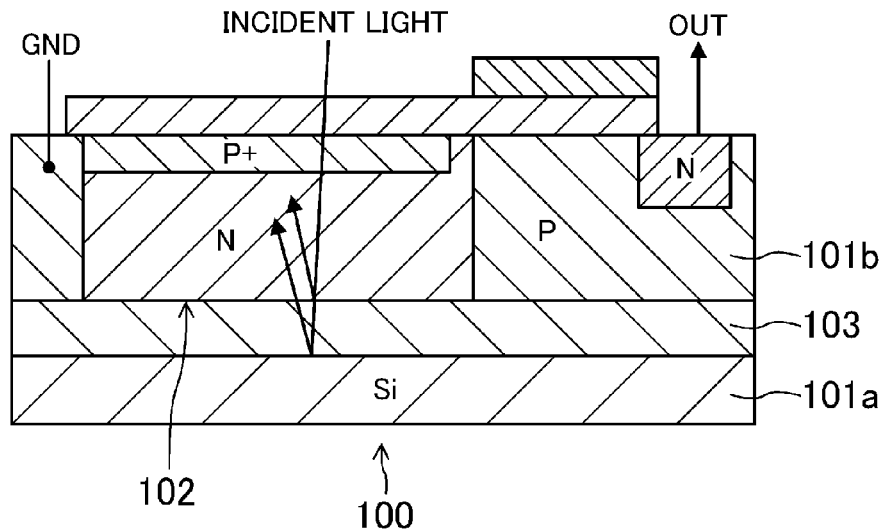
FIG. 15 is a cross-sectional view illustrating the configuration of a conventional first solid-state imaging device.
Figure 16:
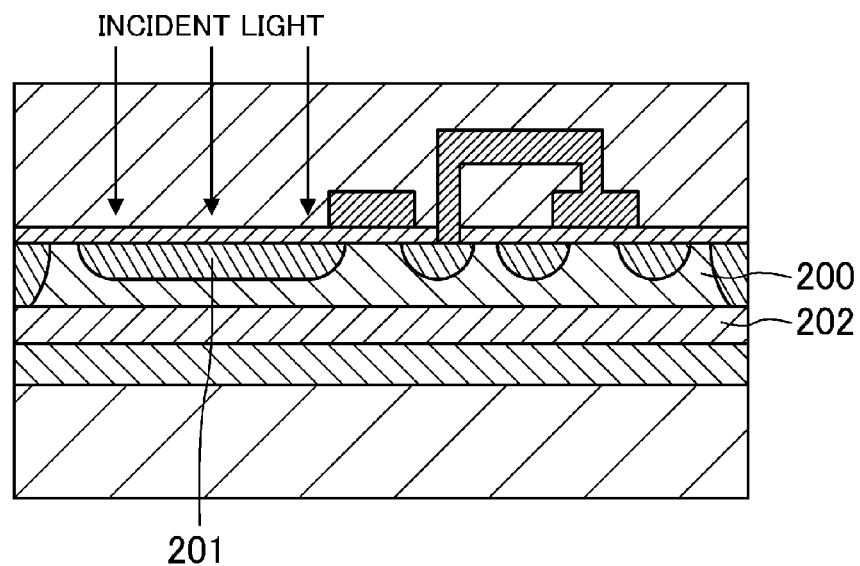
FIG. 16 is a cross-sectional view illustrating the configuration of a conventional second solid-state imaging device.

As illustrated in FIG. 14, a pixel array region 12 includes color filters 44 formed over a silicon layer 33. Light that has entered photodiodes 34 formed in corresponding pixels through the corresponding color filters 44 is absorbed in the photodiodes 34. In this embodiment, color filters 44 arranged in a Bayer pattern, for example, are used, and filters 44a through which green light transmits, and filters 44b through which blue light transmits are alternately formed. The photodiodes 34a of some of the pixels on which green light is incident are each partially located under the photodiode 34b of a corresponding one of some of the pixels on which blue light is incident. As described above, when the thickness of the silicon layer 33 is, e.g., 2.4 µm, 99.8% of blue light having a wavelength of 450 nm is absorbed in the silicon layer 33. Thus, even when the photodiode 34a of each of some of the pixels on which green light is incident is partially located under the photodiode 34b of one of the pixels on which blue light is incident and which is adjacent to the pixel on which green light is incident, the sensitivity is not reduced. Also when light that has entered a green pixel is reflected off the interface between the insulator layer 31 and the semiconductor layer 32, and the reflected light leaks into a blue pixel adjacent to the green pixel, part of the photodiode 34a of the green pixel can be placed under the photodiode 34b of the blue pixel to prevent optical crosstalk. In this embodiment, for example, the photodiode 34b of each of blue pixels extends from the front surface of the silicon layer 33 to a depth of 1.3 µm. A portion of the photodiode 34a of a green pixel under the photodiode 34b of the blue pixel extends from a depth of 1.8 µm from the front surface of the silicon layer 33 to a depth of 3 µm therefrom. This allows the sensitivity of the blue pixel to be about 2% lower, but allows crosstalk from the green pixel to the blue pixel to be about 40% lower, and allows the sensitivity of the green pixel to be about 2% higher, than when the photodiode 34b of the blue pixel extends from the front surface of the silicon layers 33 to a depth of 3 µm. In this embodiment, the color filters 44 are arranged in a Bayer pattern, and the filters 44a through which green light transmits, and the filters 44b through which blue light transmits are formed. However, also when filters through which red light transmits, and filters through which green light transmits are formed, similar advantages can be provided. Furthermore, when different filters are used, similar advantages are provided as long as a photodiode of a pixel on which long wavelength light is incident is partially located under a photodiode of a pixel on which short wavelength light is incident.

According to the solid-state imaging device of the fifth embodiment, defects in a photoelectric converter, such as white blemishes, can be reduced, thereby obtaining a high-sensitivity solid-state imaging device exhibiting low optical crosstalk.

The solid-state imaging device according to the present disclosure and the method for fabricating the same was described above based on the embodiments. However, the present disclosure is not limited to the embodiments. Note that the scope of the present disclosure also includes configurations in which various changes conceived by those skilled in the art are made to the embodiments, and configurations in which components of different embodiments are combined together without departing from the spirit of the present disclosure.

As described above, the solid-state imaging device of the present disclosure and the method for fabricating the same can prevent defects in a photoelectric converter, such as white blemishes, and are useful, in particular, as a solid-state imaging device, such as a MOS image sensor, including pixels that each include a photoelectric converter and are arranged in an array pattern, and a method for fabricating the same.

What is claimed is:
1. A method for fabricating a solid-state imaging device, the method comprising:
  forming an insulator layer on a substrate;
  forming a semiconductor layer on the insulator layer;
  forming a silicon layer on the semiconductor layer by epitaxial deposition, CVD or bonding; and
  forming a plurality of pixels in the silicon layer, the plurality of pixels each including a photoelectric converter configured to convert light into signal charge, and a circuit configured to read the signal charge, wherein a refractive index of the insulator layer is lower than a refractive index of the semiconductor layer, the substrate, the insulator layer, the semiconductor layer, and the silicon layer are sequentially stacked on one another in the foregoing order, the substrate is not in direct contact with the silicon layer, and the substrate is not in direct contact with the semiconductor layer.

2. The method of claim 1, further comprising:

forming a groove to pass through the silicon layer, the semiconductor layer, and the insulator layer and expose a part of the substrate.

3. The method of claim 1, wherein the semiconductor layer has a thickness of about 100-500 nm.

4. A solid-state imaging device comprising:

a substrate;

an insulator layer formed on the substrate;

a semiconductor layer formed on the insulator layer;

a silicon layer formed on the semiconductor layer, and a plurality of pixels formed in the silicon layer, the plurality of pixels each including a photoelectric converter configured to convert light into signal charge, and a circuit configured to read the signal charge, wherein a refractive index of the insulator layer is lower than a refractive index of the semiconductor layer, the substrate, the insulator layer, the semiconductor layer, and the silicon layer are sequentially stacked on one another in the foregoing order, the circuit includes at least one transistor, a photodetection surface of the photoelectric converter and a gate electrode of the transistor are disposed on a same surface of the silicon layer remote from the semiconductor layer, the substrate is not in direct contact with the silicon layer, and the substrate is not in direct contact with the semiconductor layer.

5. The solid-state imaging device of claim 4, wherein the insulator layer contains any one of a silicon oxide film, a silicon nitride film, and a metal oxide film that each contain an impurity.

6. The solid-state imaging device of claim 4, wherein the insulator layer contains a p-type impurity, and a concentration of the p-type impurity in the insulator layer is greater than or equal to about $1 \times 10^{10}$ ions/cm$^3$.

7. The solid-state imaging device of claim 4, wherein the semiconductor layer is made of silicon containing an impurity, and a concentration of the impurity in the semiconductor layer is greater than or equal to about $1 \times 10^{17}$ ions/cm$^3$.

8. The solid-state imaging device of claim 4, wherein an SFQR of an interface between the insulator layer and the semiconductor layer, which is a local flatness of the interface, is equal to or less than about 0.1 µm.

9. The solid-state imaging device of claim 4, wherein the silicon layer includes an imaging area on which light is incident, and an optical black area shielded from light to prevent light from entering the optical black area, and a groove is formed between the imaging area and the optical black area to pass through the silicon layer, the semiconductor layer, and the insulator layer and expose a part of the substrate.

10. The solid-state imaging device of claim 4, wherein portions of the insulator layer corresponding to the pixels have different thicknesses.

11. The solid-state imaging device of claim 4, wherein the semiconductor layer has a thickness of about 100-500 nm.

12. The solid-state imaging device of claim 4, wherein the plurality of pixels include a first pixel and a second pixel, the first pixel includes a first photoelectric converter, the second pixel includes a second photoelectric converter adjacent to the first photoelectric converter, the solid-state imaging device further includes a first color filter and a second color filter formed on the first photoelectric converter and the second photoelectric converter, respectively, a light having a longer wavelength than a wavelength of a light transmitted through the second color filter is transmitted through the first color filter, and a part of the first photoelectric converter is located under the second photoelectric converter.

13. The solid-state imaging device of claim 12, wherein a green light is transmitted through the first color filter, and a blue light is transmitted through the second color filter.

14. The solid-state imaging device of claim 4, wherein the plurality of pixels include a first pixel and a second pixel, the first pixel includes a first photoelectric converter, the second pixel includes a second photoelectric converter adjacent to the first photoelectric converter, and a groove is formed between the first photoelectric converter and the second photoelectric converter to pass through the silicon layer, the semiconductor layer, and the insulator layer and expose parts of the substrate.

15. The solid-state imaging device of claim 14, wherein the groove is filled with a polysilicon film, and the semiconductor layer is fixed to a ground potential through the polysilicon film.

16. The solid-state imaging device of claim 14, wherein the substrate is an n-type semiconductor substrate, and is fixed to a power supply potential.

17. The solid-state imaging device of claim 14, wherein a width of the groove increases from the semiconductor layer to the substrate.

* * * * *